(12) United States Patent
Bringivijayaraghavan et al.

(10) Patent No.: US 9,881,669 B1
(45) Date of Patent: Jan. 30, 2018

(54) WORDLINE DRIVER WITH INTEGRATED VOLTAGE LEVEL SHIFT FUNCTION

(71) Applicant: GLOBALFOUNDRIES INC., Grand Cayman (KY)

(72) Inventors: Venkatraghavan Bringivijayaraghavan, Cheyyar (IN); Vinay Bhatsoori, Kumta (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/446,091

(22) Filed: Mar. 1, 2017

(51) Int. Cl.
    *G11C 11/34* (2006.01)
    *G11C 11/419* (2006.01)
    *G11C 11/418* (2006.01)

(52) U.S. Cl.
    CPC .......... *G11C 11/419* (2013.01); *G11C 11/418* (2013.01)

(58) Field of Classification Search
    CPC ..... G11C 8/08; G11C 11/4085; G11C 11/419; G11C 11/418
    USPC .................................................... 365/185.23
    See application file for complete search history.

(56) References Cited

U.S. PATENT DOCUMENTS

| | | | | |
|---|---|---|---|---|
| 5,737,270 | A * | 4/1998 | Oppold | G11C 8/10 326/106 |
| 7,139,215 | B2 * | 11/2006 | Asano | G11C 7/1039 365/185.23 |
| 7,710,796 | B2 | 5/2010 | Cottier et al. | |
| 7,800,407 | B1 * | 9/2010 | Agarwal | H03K 19/018521 326/68 |
| 8,164,971 | B2 | 4/2012 | Wang et al. | |
| 8,218,378 | B2 | 7/2012 | Arsovski et al. | |
| 8,391,097 | B2 | 3/2013 | Chan et al. | |
| 8,427,888 | B2 | 4/2013 | Lu et al. | |
| 8,488,396 | B2 | 7/2013 | Lee et al. | |
| 8,630,139 | B2 | 1/2014 | Braceras et al. | |
| 8,902,679 | B2 | 12/2014 | Fifield et al. | |
| 2007/0263474 | A1 | 11/2007 | Liston et al. | |
| 2011/0085390 | A1 | 4/2011 | Arsovski et al. | |
| 2011/0188326 | A1 * | 8/2011 | Lee | G11C 7/00 365/189.11 |
| 2014/0159773 | A1 | 6/2014 | Shin | |
| 2014/0241046 | A1 * | 8/2014 | Song | G11C 5/147 365/154 |
| 2014/0313819 | A1 | 10/2014 | Choi et al. | |

(Continued)

*Primary Examiner* — Anthan Tran
(74) *Attorney, Agent, or Firm* — Gibb & Riley, LLC; Anthony J. Canale

(57) ABSTRACT

Disclosed is a wordline driver with an integrated voltage level shift function. This wordline driver receives a decoder output signal from a wordline address decoder operating at first voltage level. Based on the decoder output signal, it generates and outputs a wordline driving signal, which selectively activates or deactivates a selected wordline. To ensure that the selected wordline, when activated, is at a second voltage level that is higher than the first, the wordline driver uses a combination of clock signals received from multiple timing control blocks operating at the first voltage level and multiple logic gates operating the second voltage level. To ensure that this wordline driving signal remains low during power up when fluctuations occur due to the different voltage levels and, specifically, to ensure that the wordline driving signal only switches to high when it will be stable, the wordline driver can include a reset control block.

20 Claims, 4 Drawing Sheets

(56) References Cited

U.S. PATENT DOCUMENTS

2015/0206578 A1 7/2015 Goel et al.
2016/0275999 A1 9/2016 Chhabra

* cited by examiner

WORDLINE DRIVER WITH INTEGRATED VOLTAGE LEVEL SHIFT FUNCTION

BACKGROUND

Field of the Invention

The present invention relates to wordline drivers in memory arrays and, more specifically, to a wordline driver for use in a dual-rail memory array (e.g., a dual-rail static random access memory (SRAM) array).

Description of Related Art

More specifically, those skilled in the art will recognize that size and power scaling are key factors considered in modern integrated circuit design. One common technique for power scaling is to reduce the supply voltage. However, with memory cells reducing the supply voltage can increase susceptibility to soft errors (i.e., memory fails). Thus, memory arrays (e.g., static random access memory (SRAM) arrays) have been developed that incorporate two voltage rails (also referred to herein as power supply rails). Such memory arrays are referred to as dual-rail memory arrays. In these dual-rail memory arrays, a first voltage rail is at a first voltage level and a second voltage rail is at a second voltage level that is greater than the first voltage level. The second or higher voltage level (referred to herein as a cell supply voltage (Vcs)) can be used for memory cell operations, including wordline activation, and the first or lower voltage level (referred to herein as a logic supply voltage (Vdd)) can be used for all other memory array operations, including bitline pre-charging operations. Using the second or higher voltage level (Vcs) for memory cell operations avoids soft error memory fails and using the first or lower voltage level (Vdd) for all other operations allows for reduced power consumption when having a high voltage level is not critical.

Dual-rail SRAM arrays typically incorporate a voltage level shifter (also referred to herein as a voltage level translator) between a row address decoder (also referred to herein as a wordline address decoder) and the wordline drivers for the wordlines. The row address decoder operates at the lower voltage level, decoding inputs (i.e., addresses bits) that indicate a wordline address (i.e., a row address) and outputting a decoder output signal indicative of a selected wordline. The voltage level shifter shifts the voltage level of the decoder output signal from the lower supply voltage (Vdd) to the higher supply voltage (Vcs). A wordline driver subsequently receives the voltage-shifted decoder output signal at the higher supply voltage (Vcs) and drives the selected wordline in order to activate pass-gate transistors of any memory cells connected to the selected wordline so that a desired function (e.g., read or write) can performed. It should be noted that the wordline driver must be sufficiently powerful to ensure that the potential at the far end of the selected wordline is sufficient to turn-on pass-gate transistors of all the memory cells connected thereto.

Recently, wordline drivers have been developed that incorporate the voltage level shift function in order to allow for device area scaling. However, disadvantages including, but not limited to, slower access time, slower cycle time, irregular power up, limited Vdiff (i.e., Vcs–Vdd) and/or an Nwell break requirement, have been associated with these wordline drivers.

SUMMARY

Disclosed herein is an improved wordline driver having an integrated voltage level shift function. This wordline driver can receive clock signal inputs from a first timing control block, which operates at a first voltage level and which outputs a first clock signal, and from a second timing control block, which also operates at the first voltage level and which outputs a second clock signal that is inverted relative to the first clock signal. The wordline driver can include multiple logic gates, each of which operate at a second voltage level that is higher than the first voltage level. Specifically, the logic gates can include a first logic gate, which receives the first clock signal and a decoder output signal and which outputs a first wordline control signal based on these signals. It should be noted that the decoder output signal can be received directly from a row address decoder operating at the first voltage level. The logic gates can further include a second logic gate, which receives the second clock signal and the first wordline control signal and which outputs a second wordline control signal based on these signals. This second wordline control signal can be used to generate a wordline driving signal for selectively activating and deactivating a selected wordline when high and low, respectively.

More specifically, disclosed herein is an improved wordline driver having an integrated voltage level shift function and a reset control function. This wordline driver can receive clock signal inputs from a first timing control block, which is electrically connected to a first voltage rail so as to operate at a first voltage level and which outputs a first clock signal, and from a second timing control block, which is also electrically connected to the first voltage rail so as to operate at the first voltage level and which outputs a second clock signal that is inverted relative to the first clock signal. The wordline driver can include multiple logic gates, each of which are electrically connected to a second voltage rail that is different from the first voltage rail so as to operate at a second voltage level that is higher than the first voltage level. Specifically, the logic gates can include a first logic gate, which receives the first clock signal and a decoder output signal and which outputs a first wordline control signal based on these signals. It should be noted that the decoder output signal can be received directly from a row address decoder that is also electrically connected to the first voltage rail so as to operate at the first voltage level. The logic gates can further include a second logic gate, which receives the second clock signal and the first wordline control signal and which outputs a second wordline control signal based on these signals. This second wordline control signal can be used to generate a wordline driving signal, which selectively activates and deactivates a selected wordline when high and low, respectively. The wordline driver can further include a reset control block electrically connected to the second voltage rail so as to operate at the second voltage level. This reset control block can also receive the second wordline control signal and, based on that second wordline control signal, can ensure that the wordline driving signal remains low during power up when fluctuations can occur due to the different voltage levels being used within the wordline driver and, more specifically, can ensure that the wordline driving signal only switches to high when the wordline driver is fully ready to activate the selected wordline.

Even more specifically, disclosed herein is an improved wordline driver having an integrated voltage level shift function and a reset control function. This wordline driver can receive clock signal inputs from a first timing control block (e.g., a macrosel with a two-gate delay), which is electrically connected to a first voltage rail so as to operate at a first voltage level and which outputs a first clock signal, and from a second timing control block (e.g., a macrosel with a three-gate delay), which is also electrically connected to the first voltage rail so as to operate at the first voltage level and which outputs a second clock signal that is inverted relative to the first clock signal. The wordline driver can include multiple logic gates, each of which is electrically connected to a second voltage rail that is different from the first voltage rail so as to operate at a second voltage level that is higher than the first voltage level. Specifically, the logic gates can include a first logic gate, which receives the first clock signal and a decoder output signal and which outputs a first wordline control signal based on these signals. It should be noted that the decoder output signal can be received directly from a row address decoder operating at the first voltage level. The logic gates can further include a second logic gate (e.g., a NOR gate), which receives the second clock signal and the first wordline control signal and which outputs a second wordline control signal based on these signals. This second wordline control signal can be used (e.g., by a pair of inverters connected in series between the second logic gate and a selected wordline) to generate a wordline driving signal, which selectively activates and deactivates a selected wordline when high and low, respectively. This wordline driver can further include a reset control block electrically connected to the second voltage rail so as to operate at the second voltage level. This reset control block can also receive the second wordline control signal and, based on that second wordline control signal, can ensure that the wordline driving signal remains low during power up when fluctuations can occur due to the different voltage levels being used within the wordline driver and, more specifically, can ensure that the wordline driving signal only switches to high when the wordline driver is fully ready to activate the selected wordline.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, for dual-rail memory arrays (e.g., dual-rail static random access memory (SRAM) arrays), wordline drivers that incorporate a voltage level shift function have recently been developed in order to allow for device area scaling. However, disadvantages are associated with these wordline drivers. These disadvantages include, but are not limited to, slower access time, slower cycle time, irregular power up, limited Vdiff (i.e., Vcs−Vdd) and/or an Nwell break requirement.

In view of the foregoing, disclosed herein is an improved wordline driver with an integrated voltage level shift function for a dual-rail memory array (e.g., a dual-rail static random access memory (SRAM) array). This wordline driver receives a decoder output signal for a selected wordline directly from a row address decoder, which operates at a first voltage level (e.g., at Vdd). Based on the decoder output signal, the wordline driver generates and outputs a wordline driving signal, which selectively activates and deactivates (i.e., sets and resets) the selected wordline. To ensure that the selected wordline, when activated, is at a second voltage level that is higher than the first voltage level (e.g., at Vcs), the wordline driver uses a combination of clock signals received from multiple timing control blocks operating at the first voltage level and multiple logic gates operating the second voltage level. Additionally, to ensure that this wordline driving signal remains low during power up when fluctuations can occur due to the different voltage levels being used within the wordline driver and, more specifically, to ensure that the wordline driving signal only switches to high when the wordline driver is fully ready to activate the selected wordline, the wordline driver can further include a reset control block.

Figure 1:
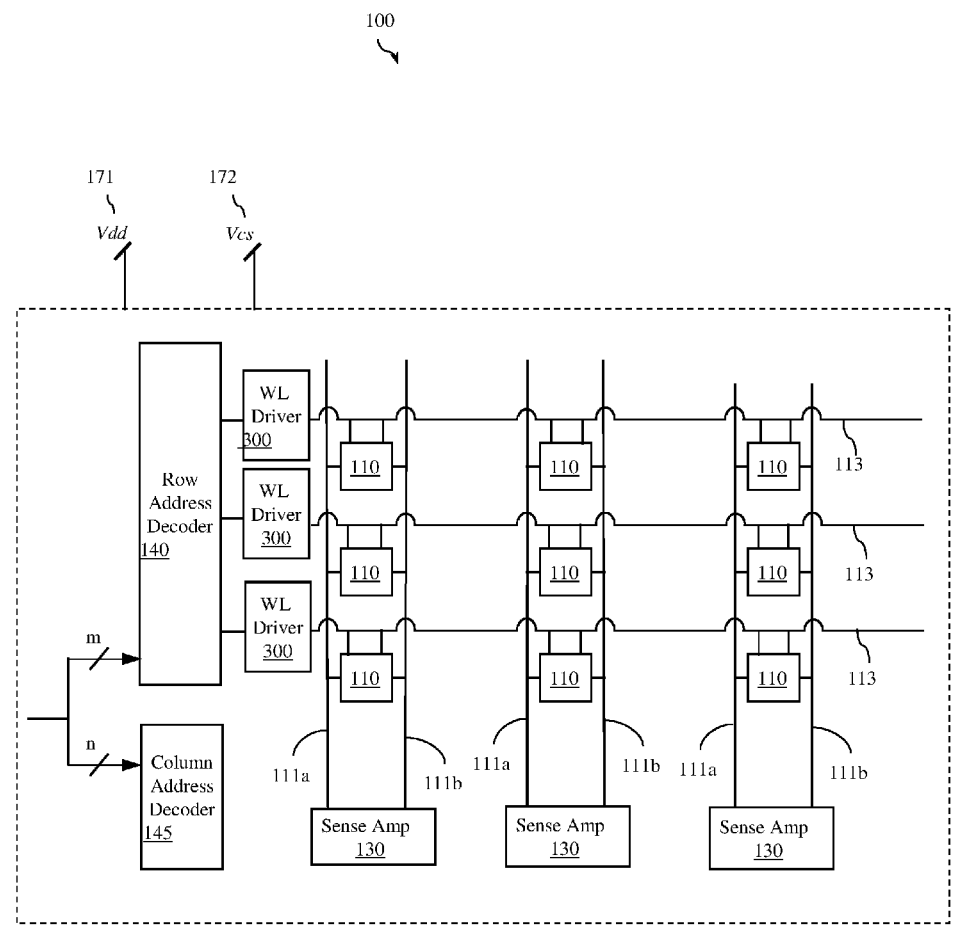
FIG. 1 is a schematic diagram illustrating a dual-rail memory array that includes a wordline driver with an integrated voltage level shift function.

More particularly, disclosed herein are embodiments of a wordline driver 300 for a dual-rail memory array 100, as shown in FIG. 1, wherein the wordline driver 300 has an integrated voltage level shift function and a reset control function.

As with a conventional memory array, a dual-rail memory array 100 can generally include a plurality of memory cells 110, which are arranged in rows and columns.

Figure 2:
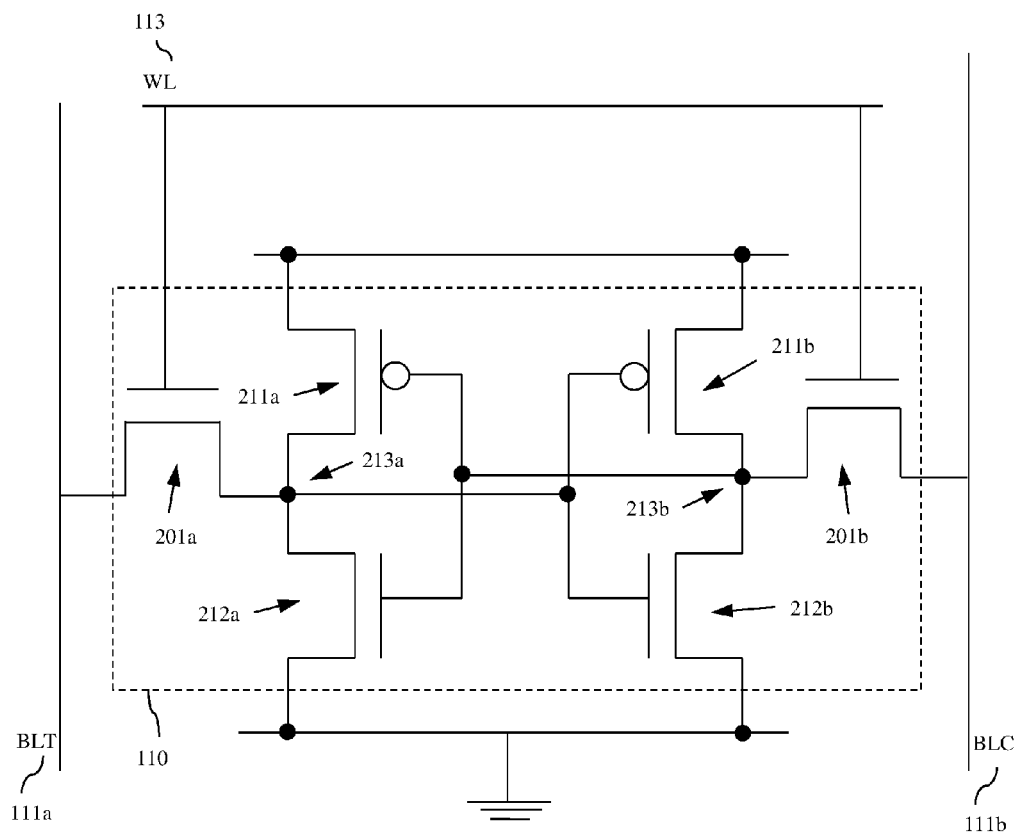
FIG. 2 is a schematic diagram illustrating an exemplary memory cell and, particularly, a static random access memory (SRAM) cell that can be incorporated into the memory array of FIG. 1.

Each memory cell 110 can be, for example, a static random access memory (SRAM) cell, as shown in FIG. 2. An SRAM cell and, particularly, a six-transistor (6T) SRAM cell includes a pair of access transistors (also referred to as pass-gate transistors) 201a, 201b (e.g., N-type field effect transistors) and a pair of cross-coupled inverters. Each inverter can include a pull-up transistor 211a, 211b (e.g., a P-type field effect transistor) connected in series to a pull-down transistor 212a, 212b (e.g., an N-type field effect transistor). The drain of one of the access transistors (e.g., access transistor 201a) can be connected to a node 213a between the pull-up and pull-down transistors 211a and 212a of one of the inverters and the drain of the other access transistor (e.g., access transistor 201b) can be connected to a node 213b between the pull-up and pull-down transistors 211b and 212b of the other inverter. Furthermore, the source of one of the access transistors (e.g., access transistor 201a) can be connected to one bitline of a complementary pair of bitlines (e.g., the bitline 111a, which is also referred to as a true bitline (BLT)) and the source of the other access transistor (e.g., access transistor 201b) can be connected to the other bitline in the complementary pair of bitlines (e.g., the bitline 111b, also referred to as the complementary bitline (BLC)). The gates of the access transistors 201a, 201b can be connected to a wordline (WL) 113.

A 6T SRAM cell 110 can operate in three different stages: standby, write and read. In the standby state, the cell is idle. In the write stage, a data value is written into the cell. Specifically, if a data value of "1" (i.e., a high data value) is to be written to the node 213a, a "1" is applied to the bitline 111a and a "0" is applied to the bitline 111b. Then, the wordline 113 is activated to enable the access transistors 201a, 201b and the data value "1" is stored at node 213a. Contrarily, if a data value of "0" (i.e., a low data value) is to be written to the node 213a, a "0" is applied to the bitline 111a and a "1" is applied to the bitline 111b. Then, the wordline 113 is activated to enable the access transistors 201a, 201b and the data value "0" is stored at node 213a. In the reading stage, the data value stored in the cell is read. Specifically, the bitlines 111a, 111b are both pre-charged high (i.e., to a "1") and the wordline 113 is activated to enable the access transistors 201a, 201b. When a data value of "1" is stored on node 213a, bitline 111a will remain charged at its pre-charge level of "1" and the bitline 111b will be discharged to "0" through the transistors 212b and 201b. When a data value of "0" is stored on node 213a, bitline 111a will be discharged to "0" through transistors 212a and 201a and the bitline 111b will remain charged at its pre-charge level of "1". A sense amplifier 130 at the end of each column will sense whether bitline 111a or 111b is higher and, thereby will sense the data value stored in the cell 110.

The above description of a 6T SRAM cell and its operation is offered for illustration purposes only and is not intended to be limiting. It should be understood that a 6T SRAM cell with an alternative configuration, another type of SRAM cell (e.g., an eight transistor SRAM cell) or another type of memory cell could alternatively be incorporated into the memory array 100.

Referring again to FIG. 1, the memory array 100 can further include peripheral circuitry that facilitates writing data values to and reading data values from the individual memory cells 110. The peripheral circuitry can include, but is not limited to, a row address decoder 140 (also referred to as a wordline address decoder), wordline drivers 300, a column address decoder 145, sense amplifiers 130, etc. Except for the improved wordline drivers 300 disclosed herein and discussed in greater detail below, the peripheral circuitry needed to operate a memory array is well known in the art and, thus, the details thereof are omitted from this specification in order to allow the reader to focus on the salient aspects of the embodiments.

In any case, while a conventional memory array operates at a single voltage level, a dual-rail memory array 110 operates using a pair of voltage rails 171-172 (also referred to herein as power supply rails) set at different voltage levels. Specifically, a first voltage rail 171 can be set to a first voltage level (e.g., a logic supply voltage level (Vdd)) and a second voltage rail 172 can be set to a second voltage level (e.g., a cell supply voltage level (Vcs)). The second voltage level can be used within the memory array 100 to supply power for memory cell operations, including wordline activation by the wordline driver 300, and can be sufficiently high to avoid soft errors. The first voltage level can be lower than the second voltage level and can be used for other memory array operations (e.g., bitline pre-charge operations) in order to save power. As mentioned above, a voltage level shifter (also referred to herein as a voltage level translator) is typically incorporated into a dual-rail memory array between the row address decoder and each wordline driver to accommodate the voltage level differences and, particularly, to shift the voltage level of the decoder output signal from a lower supply voltage (Vdd) to a higher supply voltage (Vcs) before that decoder output signal is provided to the wordline driver. The memory array 100 shown in FIG. 1 does not include such a voltage level shifter because, as discussed in greater detail below, the improved wordline driver 300 disclosed herein has an integrated voltage level shift function.

Figure 3:
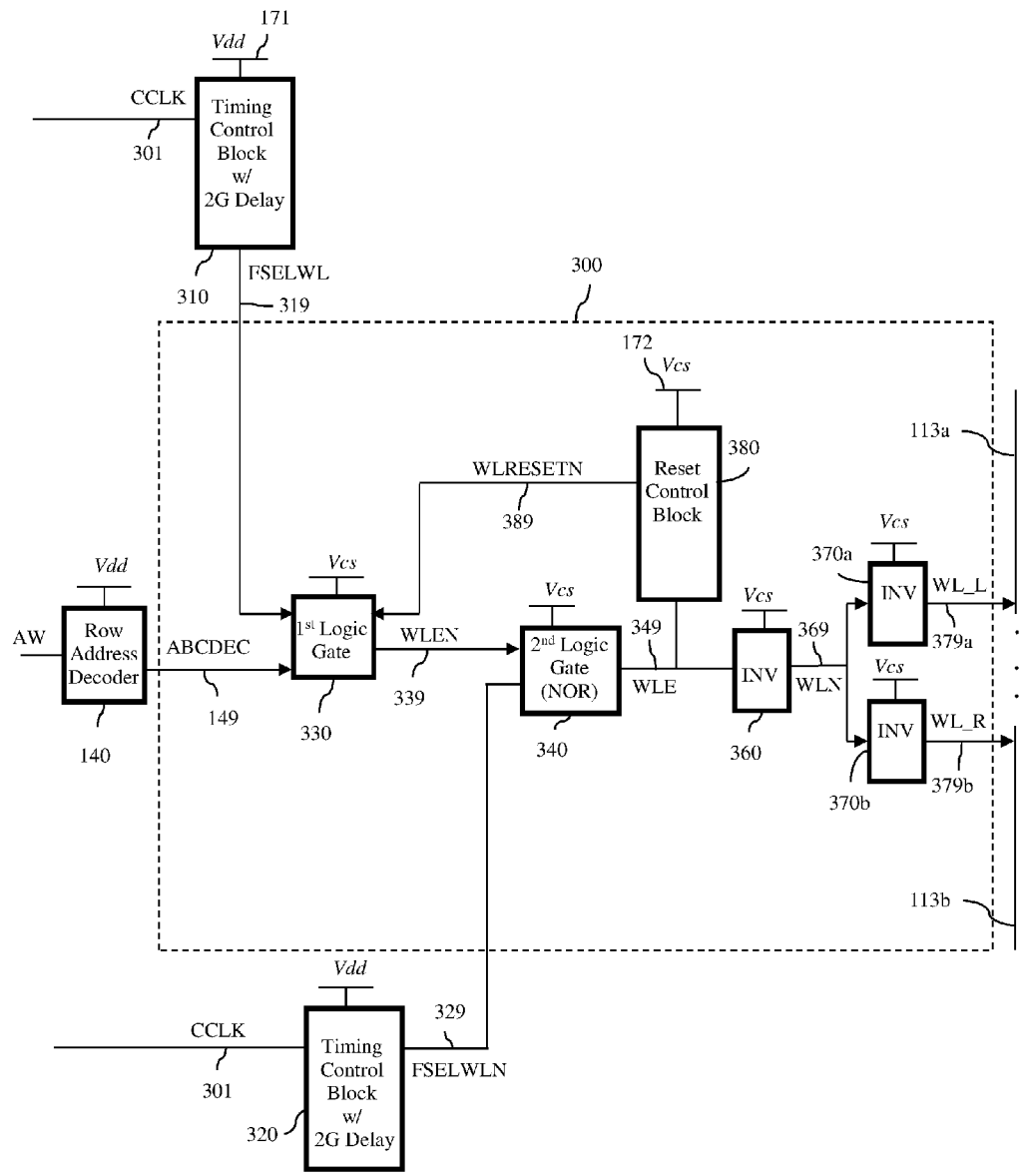
FIG. 3 is a schematic diagram illustrating a wordline driver that can be incorporated into the memory array of FIG. 1.
Figure 4:
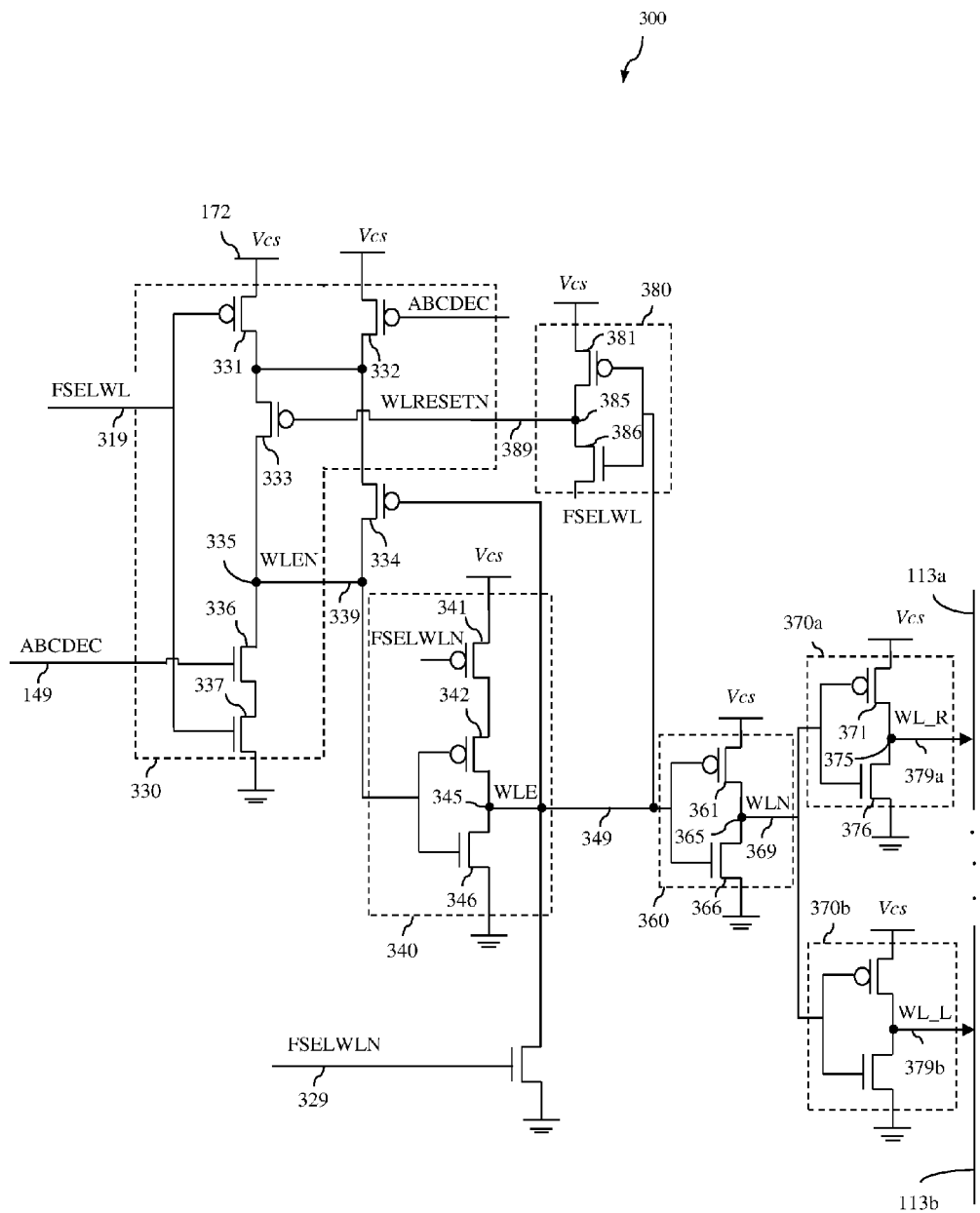
FIG. 4 is a more detailed schematic diagram illustrating a wordline driver 300 that can be incorporated into the memory array of FIG. 1.

More particularly, FIG. 3 is a high level schematic diagram illustrating a wordline driver 300 having an integrated voltage level shift function and a reset control function. FIG. 4 is a more detailed schematic diagram illustrating the wordline driver 300 including exemplary configurations for the logic gates incorporated therein.

The wordline driver 300 can receive a pair of clock signal inputs 319 and 329 from a pair of timing control blocks including a first timing control block 310 and a second timing control block 320. Specifically, each of these timing control blocks 310, 320 can be connected to the first voltage rail 171 so as to operate at the first voltage level (Vdd). Each of these timing control blocks 310, 320 can also receive and process an initial clock signal (CCLK) 301. The first timing control block 310 can be configured so as to have a two-gate delay and can output a first clock signal (FSELWL) 319. The second timing control block 320 can be configured so as to have a three-gate delay and can output a second clock signal (FSELWLN) 329 that is inverted and delayed by a one-gate delay relative to the first clock signal 319. Timing control blocks with multiple gate delays are well known in the art and, thus, the details of such blocks are omitted from this specification in order to allow the reader to focus on the salient aspect of the disclosed structure.

The wordline driver 300 can include multiple logic gates, each of which is connected to the second voltage rail 172 so as to operate at the second voltage level (Vcs), which, as mentioned above, is higher than the first voltage level (Vdd). The multiple logic gates operating at the second voltage level (Vcs) can include a first logic gate 330, a second logic gate 340, multiple inverters 360, 370a-b and a reset control block 380.

The first logic gate 330 can receive, as inputs, at least the first clock signal 319 from the first timing control block 310, a decoder output signal (ABCDEC) 149 from the row address decoder 140, and a reset control signal (WLRESETN) 389 from a reset control block 380 (as discussed in greater detail below). This first logic gate 330 can further output a first wordline control signal (WLEN) 339 at a first output node 335 based on these signals.

More specifically, as illustrated in FIG. 4, this first logic gate 330 can include a first output node 335, multiple p-type field effect transistors (PFETs) (e.g., see PFETs 331-333 and optional PFET 334), and multiple n-type field effect transistors (NFETs) (e.g., see NFETs 336-337). Specifically, the multiple PFETs of the first logic gate 330 can include a first PFET 331 and a second PFET 332 connected in parallel between the second voltage rail 172 and a third PFET 333, which has a source region connected to the drain regions of the first and second PFETs and a drain region connected to the output node 335. Optionally, a fourth PFET 334 can be connected in series between the second PFET 332 and the output node 335. The multiple NFETs of the first logic gate 330 can include a first NFET 336 and a second NFET 337 connected in series between the first output node 335 and ground. Within the first logic gate 330, the first PFET 331 and the second NFET 337 can be controlled by the first clock signal 319. That is, the first clock signal 319 from the first timing control block 310 can be applied to the gates of the first PFET 331 and the second NFET 337. The second PFET 332 and the first NFET 336 can be controlled by the decoder output signal 149. That is, the decoder output signal 149 can be applied to the gates of the second PFET 332 and the first NFET 336. The third PFET 333 can be controlled by a reset control signal (WLRESETN) 389 from a reset control block 380 (as discussed in greater detail below) and the fourth PFET 334, if included, can be controlled by a second wordline control signal (WLE) 349 output from the second logic gate 340 (as discussed in greater detail below).

The output on the first output node 335 is a first wordline control signal 339 generated based on the values of the first clock signal 319, the decoder output signal 149, the reset control signal 389 and, optionally, the second wordline control signal 349. Those skilled in the art will recognize that the output of this logic gate will be low, when all of the inputs are high.

The second logic gate 340 can be a logic NOR gate, which receives, as inputs, the second clock signal 329 from the second timing control block 320 and the first wordline control signal 339 from the first logic gate 330. This NOR gate 340 can output a second wordline control signal (WLE) 349 at a second output node 345 based on these signals.

For example, as illustrated in FIG. 4, this second logic gate 340 (i.e., the logic NOR gate) can include a second output node 345, a pair of p-type field effect transistors (PFETs) 341-342, and an n-type field effect transistor (NFET) 346. Specifically, the pair of PFETs 341 can be connected in series between the second voltage rail 172 and the second output node 345. The NFET 346 can be connected between the second output node 345 and ground. Within the NOR gate 340, the PFET 341 can be controlled by the second clock signal 329. That is, the second clock signal 329 from the second timing control block 320 can be applied to the gate of the PFET 341. Additionally, the PFET 342 and the NFET 346 can be controlled by the first wordline control signal 339. That is, the first wordline control signal 339 from the first output node 335 of the first logic gate 330 can be applied to the gates of the PFET 342 and the NFET 346. The output on the second output node 345 is a second wordline control signal (WLE) 349 generated based on the values of the second clock signal 329 and the first wordline control signal 339.

Optionally, this second wordline control signal 349 can be used as feedback to the first logic gate 330 and, specifically, applied to the gate of the fourth PFET 334. Additionally, as discussed in greater detail below, this second wordline control signal 349 can be used by the inverters 360, 370a-b to generate at least one wordline driving signal to selectively activate and deactivate a selected wordline when high and low, respectively.

The inverters can include a first inverter 360 and at least one additional inverter (see additional inverters 370a-b). The first inverter 360 can receive, as an input, the second wordline control signal 349 and can output an inverted wordline control signal (WLN) 369. For example, as illustrated in FIG. 4, the first inverter 360 can include a p-type field effect transistor (PFET) 361 connected between the second voltage rail 172 and a third output node 365 and an n-type field effect transistor (NFET) 366 connected between the third output node 365 and ground. The gates of the PFET 361 and NFET 366 can be controlled by the second wordline control signal 349. That is, the second wordline control signal 349 from the second logic gate 340 (i.e., the logic NOR gate) can be applied to the gates of the PFET 361 and the NFET 366. The output on the third output node 365 is an inverted wordline control signal 369 generated so as to be inverted relative to the second wordline control signal 349.

The inverters can further include at least one additional inverter 370a connected in series between the first inverter 360 and the selected wordline 113. Note, optionally, the wordline driver 300 can include multiple additional inverters (e.g., see additional inverters 370a-370b), wherein each additional inverter is electrically connected in series between the output node 365 of the first inverter 360 and a different segment (e.g., see wordline segments 113a-113b) of the same wordline. Each additional inverter 370a-370b can receive the inverted wordline control signal 369, can invert that signal and can output a wordline driving signal (e.g., see WL_R 379a from additional inverter 370a and WL_L 370b from additional inverter 370b) to the selected wordline or segment thereof, as applicable. For example, as illustrated in FIG. 4, the each additional inverter 370a or 370b can include a p-type field effect transistor (PFET) 371 connected between the second voltage rail 172 and a fourth output node 375 and an n-type field effect transistor (NFET) 376 connected between the fourth output node 375 and ground. The gates of the PFET 371 and NFET 376 can be controlled by the inverted wordline control signal 369. That is, the inverted wordline control signal 369 from the first inverter 360 can be applied to the gates of the PFET 371 and the NFET 376. The output on the fourth output node 375 is a wordline driving signal generated so as to be inverted relative to the inverted wordline control signal 369.

The reset control block 380 can receive, as an input, the second wordline control signal 349 and can output a reset control signal 389. For example, as illustrated in FIG. 4, the reset control block 380 can be yet another inverter, which includes a p-type field effect transistor (PFET) 381 connected between the second voltage rail 172 and a fifth output node 385 and an n-type field effect transistor (NFET) 386 having its drain connected to the fifth output node 385 and, optionally, having its source connected to the first clock signal 319. The gates of the PFET 381 and NFET 386 can be controlled by the second wordline control signal 349. That is, the second wordline control signal 349 from the second logic gate 340 (i.e., the logic NOR gate) can be applied to the gates of the PFET 381 and the NFET 386. The output on the fifth output node 368 is a reset control signal 389 generated so as to be inverted relative to the second wordline control signal 349.

This reset control signal 389 can, as mentioned above, be one of the inputs to the first logic gate 330 and can ensure that the wordline driving signal(s) output from the additional inverter(s) 370a-370b remain low during power up immediately prior to activation of the selected wordline.

More specifically, when a selected wordline 113 is deactivated or low, the wordline driving signal(s) 370a-b out of the additional inverter(s) 370a-b will be low, the inverted wordline control signal 369 out of the first inverted 360 will be high and the second wordline control signal 349 out of the second logic gate 340 (i.e., the NOR gate) will be low. This second wordline control signal 349 will remain low and, thus, the selected wordline will remain deactivated as long as any of the inputs to the second logic gate 340 (i.e., the second clock signal 329 from the second timing control block 320 and/or the first wordline control signal 339 from the first logic gate 330) are high. That is, the second wordline control signal 349 will only switch from low to high, thereby activating the selected wordline 113, when the second clock signal 329 and the first wordline control signal 339 are both low.

It should be noted that, if the optional fourth PFET 334 is present in the first logic gate 330 and, particularly, connected in series between the second PFET 332 and the first output node 335 and if this fourth PFET 334 is controlled by the second wordline control signal 349, as discussed above and illustrated in FIG. 4, a low second wordline control signal 349 will turn on the fourth PFET 334 and further boost the voltage on the first output node 335. The boost to voltage on the first output node 335 keeps the second wordline control signal 349 low and, thereby ensures that the selected wordline remains in the deactivated state.

However, when the selected wordline is to be activated, the decoder output signal 149 will switch from low to high and as the first clock signal 319 also switches from low to high, power-up of the wordline driver 300 will begin. That is, within the first logic gate 330, the first and second PFETs 331-332 will start to turn off and the first and second NFETs 336-337 will start to turn on in order to cause the first wordline control signal 339 to switch from high to low. In this case, since the first clock signal 319 and the decoder output signal 149 are generated at the first voltage level (Vdd) and since the first logic gate 330 operates at the second voltage level, the first PFET 331 and the second PFET 332 may not turn completely off. In the absence of the third PFET 333, partially turned-on PFETs 331-332 could try to pull-up the voltage on the first output node 335 such that fluctuations could occur in the value of the first wordline control signal 339, thereby causing fluctuations in the value of the second wordline control signal 349.

To prevent these fluctuations from propagating through to the wordline driving signal(s) 379a-b and, more specifically, to ensure that the wordline driving signal(s) only switch from low to high when the wordline driver 300 is fully ready to activate the selected wordline 113, the third PFET 333 is controlled by the reset control signal 389. Specifically, as long as the second wordline control signal 349 from the second logic gate 340 is low, the reset control signal 389, which is output from the reset control block 380 and which controls the third PFET 331, will be high. Since the reset control block 380 operates at the second voltage level (Vcs), a high reset control signal on the gate of the third PFET 333 will ensure that the third PFET 333 stays turn-off, thereby preventing the first PFET 331 and the second PFET 332 from pulling up the voltage on the first output node 335 and allowing the first NFET 336 and the second NFET 337 to pull down the voltage on the first output node 335. Once the voltage on the first output node 335 is pulled down and the second clock signal 329 (which is delayed by a one-gate delay and inverted relative to the first clock signal 319) switches from high to low, the output of the second logic gate 340 (i.e., the NOR gate) at the second output node 345 will switch from low to high. As discussed above, when the second wordline control signal 349 is high, the inverted wordline control signal 369 will switch to low and the wordline driving signal(s) 379a-b will switch to high, thereby activating the selected wordline or portions thereof.

As mentioned above, the source of the NFET 386 in the reset control block 380 can be connected to the first clock signal 319. When the wordline driving signal(s) 379a-b are driven high (i.e., when the wordline is activated), the voltage level at the fifth output node 385 of the reset control block 380 and, thereby the voltage level of the reset control signal 389 can increase due to the voltage level of the first clock signal 319 on the source of the NFET 386. As a result, the third PFET 333 in the first logic gate 330 can be partially turned off, particularly, when the second voltage level is too high compared to first voltage level (i.e., at max Vdiff corners). In fact, when the wordline control signal(s) 379a-b are driven high, all of the PFETs 331, 332 and 333 in the first logic gate 330 can be partially turned off at max Vdiff corners. The third PFET 333 is specifically included in the first logic gate 330 to provide a resistive path to minimize a resulting bump at the wordline control signal 339.

Therefore, disclosed above is an improved wordline driver 300 with an integrated voltage level shift function for a dual-rail memory array (e.g., a static random access memory (SRAM) array). This wordline driver receives a decoder output signal for a selected wordline directly from a row address decoder, which operates at a first voltage level (e.g., at Vdd). Based on the decoder output signal, the wordline driver generates and outputs a wordline driving signal, which selectively activates or deactivates (i.e., sets or resets) the selected wordline. To ensure that the selected wordline, when activated, is at a second voltage level that is higher than the first voltage level (e.g., at Vcs), the wordline driver uses clock signals received from multiple timing control blocks operating at the first voltage level to control multiple logic gates operating the second voltage level. Additionally, to ensure that this wordline driving signal remains low during power up when fluctuations can occur due to the different voltage levels being used within the wordline driver and, more specifically, to ensure that the wordline driving signal only switches to high when the wordline driver is fully ready to activate the selected wordline, the wordline driver can further include a reset control block. The improved wordline driver with an integrated voltage level shift function, as disclosed herein, allows for a faster access time, a faster cycle time, regular power up, and unlimited Vdiff (i.e., Vcs–Vdd). Furthermore, it eliminates the requirement for an Nwell break because there are no logic gates operating at the first voltage level within the wordline driver.

It should be understood that the terminology used herein is for the purpose of describing the disclosed circuit and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A wordline driver comprising:
    a first logic gate receiving a first clock signal and a decoder output signal and outputting a first wordline control signal, the first clock signal being received from a first timing control block operating at a first voltage level and the first logic gate operating at a second voltage level that is higher than the first voltage level; and,
a second logic gate receiving a second clock signal and the first wordline control signal and outputting a second wordline control signal, the second clock signal being inverted relative to the first clock signal and being output from a second timing control block operating at the first voltage level and the second logic gate operating at the second voltage level.

2. The wordline driver of claim 1, the first clock signal having a two-gate delay relative to an initial clock signal and the second clock signal having a three-gate delay relative to the initial clock signal.

3. The wordline driver of claim 1, the decoder output signal being output to the first logic gate from a row address decoder operating at the first voltage level.

4. The wordline driver of claim 1, the second logic gate comprising a NOR gate.

5. The wordline driver of claim 1, further comprising a first inverter and at least one additional inverter connected in series between the second logic gate and a selected wordline, the first inverter and each additional inverter operating at the second voltage level, the first inverter receiving the second wordline control signal from the second logic gate and outputting an inverted wordline control signal and each additional inverter receiving the inverted wordline control signal and outputting a wordline driving signal to the selected wordline.

6. The wordline driver of claim 1, further comprising a reset control block receiving the second wordline control signal and, based on the second wordline control signal, ensuring that the wordline driving signal remains low during power up.

7. The wordline driver of claim 1, the first wordline control signal remaining high whenever the second wordline control signal is low.

8. A wordline driver comprising:
a first logic gate receiving a first clock signal and a decoder output signal and outputting a first wordline control signal, the first clock signal being received from a first timing control block that is electrically connected to a first voltage rail so as to operate at a first voltage level, and the first logic gate being electrically connected to a second voltage rail so as to operate at a second voltage level that is higher than the first voltage level;
a second logic gate receiving a second clock signal and the first wordline control signal and outputting a second wordline control signal, the second clock signal being inverted relative to the first clock signal and being received from a second timing control block that is electrically connected to the first voltage rail so as to operate at the first voltage level, the second logic gate being electrically connected to the second voltage rail so as to operate at the second voltage level, and the second wordline control signal being used to generate a wordline driving signal for activation and deactivation of a selected wordline; and
a reset control block electrically connected to the second voltage rail so as to operate at the second voltage level, the reset control block receiving the second wordline control signal and, based on the second wordline control signal, ensuring that the wordline driving signal remains low during power up.

9. The wordline driver of claim 8, the first clock signal having a two-gate delay relative to an initial clock signal and the second clock signal having a three-gate delay relative to the initial clock signal.

10. The wordline driver of claim 8, the decoder output signal being output to the first logic gate from a row address decoder that is electrically connected to the first voltage rail so as to operate at the first voltage level.

11. The wordline driver of claim 8, the second logic gate comprising a NOR gate.

12. The wordline driver of claim 8, further comprising a first inverter and at least one additional inverter connected in series between the second logic gate and the selected wordline, the first inverter and each additional inverter being electrically connected to the second voltage rail so as to operate at the second voltage level, the first inverter receiving the second wordline control signal from the second logic gate and outputting an inverted wordline control signal and each additional inverter receiving the inverted wordline control signal and outputting the wordline driving signal to the selected wordline.

13. The wordline driver of claim 8, further comprising a p-type field effect transistor electrically connected between the second voltage rail and an output node of the first logic gate, the p-type field effect transistor being controlled by the second wordline control signal.

14. A wordline driver comprising:
a first logic gate receiving a first clock signal and a decoder output signal and outputting a first wordline control signal, the first clock signal being received from a first timing control block that is electrically connected to a first voltage rail so as to operate at a first voltage level and the first logic gate being electrically connected to a second voltage rail so as to operate at a second voltage level that is higher than the first voltage level;
a second logic gate comprising a NOR gate receiving a second clock signal and the first wordline control signal and outputting a second wordline control signal, the second clock signal being inverted relative to the first clock signal and being received from a second timing control block that is electrically connected to the first voltage rail so as to operate at the first voltage level, the second logic gate being electrically connected to the second voltage rail so as to operate at the second voltage level, and the second wordline control signal being used to generate a wordline driving signal for activation and deactivation of a selected wordline; and
a reset control block electrically connected to the second voltage rail so as to operate at the second voltage level, the reset control block receiving the second wordline control signal and, based on the second wordline control signal, ensuring that the wordline driving signal remains low during power up.

15. The wordline driver of claim 14, the first clock signal having a two-gate delay relative to an initial clock signal and the second clock signal having a three-gate delay relative to an initial clock signal.

16. The wordline driver of claim 14, the decoder output signal being output to the first logic gate from a row address decoder that is electrically connected to the first voltage rail so as to operate at the first voltage level.

17. The wordline driver of claim 14, further comprising a first inverter and at least one additional inverter connected in series between the second logic gate and the selected wordline, the first inverter and each additional inverter being electrically connected to the second voltage rail so as to operate at the second voltage level, the first inverter receiving the second wordline control signal from the second logic gate and outputting an inverted wordline control signal and each additional inverter receiving the inverted wordline control signal and outputting the wordline driving signal to the selected wordline.

18. The wordline driver of claim 14,
the first logic gate comprising:
an output node;
a first p-type field effect transistor and a second p-type field effect transistor connected in parallel between the second voltage rail and a third p-type field effect transistor connected to the output node; and
a first n-type field effect transistor and a second n-type field effect transistor connected in series between the output node and ground,
the first p-type field effect transistor and the second n-type field effect transistor being controlled by the first clock signal,
the second p-type field effect transistor and the first n-type field effect transistor being controlled by the decoder output signal,
the third p-type field effect transistor being controlled by a reset control signal, and
the first wordline control signal being output at the output node.

19. The wordline driver of claim 18, the reset control signal controlling the third p-type field effect transistor in order to ensure that the wordline driving signal remains low during power up.

20. The wordline driver of claim 18, the first logic gate further comprising an additional p-type field effect transistor electrically connected between the second p-type field effect transistor and the output node, the additional p-type field effect transistor being controlled by the second wordline control signal.

* * * * *